(12) United States Patent
Nakajima (10) Patent No.: US 7,598,672 B2
(45) Date of Patent: Oct. 6, 2009

(54) ORGANIC ELECTROLUMINESCENT DEVICE, METHOD OF MANUFACTURING ORGANIC ELECTROLUMINESCENT DEVICE, AND ELECTRONIC APPARATUS

(75) Inventor: Akira Nakajima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 735 days.

(21) Appl. No.: 11/340,595

(22) Filed: Jan. 27, 2006

(65) Prior Publication Data

US 2006/0197095 A1 Sep. 7, 2006

(30) Foreign Application Priority Data

Mar. 7, 2005 (JP) ............... 2005-062012

(51) Int. Cl.
*H01J 1/62* (2006.01)
(52) U.S. Cl. ........................... 313/512; 445/23
(58) Field of Classification Search ......... 313/504–512; 445/23–25
See application file for complete search history.

(56) References Cited

FOREIGN PATENT DOCUMENTS

| JP | A-04-020929 | 1/1992 |
|----|-------------|--------|
| JP | A-11-067446 | 3/1999 |
| JP | A-2001-210464 | 8/2001 |
| JP | A-2003-066868 | 3/2003 |

*Primary Examiner*—Joseph L Williams
(74) *Attorney, Agent, or Firm*—Oliff & Berridge, PLC

(57) ABSTRACT

An organic electroluminescent device includes a first member: a light-emitting element that is formed on the first member; a second member that has a second region bonded to the first region of the first member, and forms a sealing space for sealing the light-emitting element between the first member and the second member. Each of the first and second regions has a flat surface that is provided so as to connect an end portion located at the side of the sealing space to an end portion located at the side of an external space outside of the sealing space, and a wall surface that is provided near the flat surface, and the wall surface has a first surface that is provided so as to be parallel to a first direction, and a second surface that is provided so as to be parallel to a second direction different from the first direction.

12 Claims, 11 Drawing Sheets

MEASUREMENT REGION

ORGANIC ELECTROLUMINESCENT DEVICE, METHOD OF MANUFACTURING ORGANIC ELECTROLUMINESCENT DEVICE, AND ELECTRONIC APPARATUS

BACKGROUND

1. Technical Field

The present invention relates to an organic electroluminescent (EL) device, to a method of manufacturing the organic EL device, and to an electronic apparatus.

2. Related Art

An organic EL device includes a light-emitting element that has a light-emitting layer containing a light-emitting material interposed between an anode electrode layer and a cathode electrode layer, and emits light using a phenomenon that performs light emission when a hole injected from an anode side is recombined with an electron injected from a cathode side within the light-emitting layer that has a function for emitting light and an excited state is shifted to a ground state. Since the light-emitting element is likely to be deteriorated due to moisture in the air, a sealing process is performed in the organic EL device in order to protect the light-emitting element from the air. An example of a sealing technology has been disclosed in JP-A-2001-210464.

According to the related art, it has a structure in which a concave portion and a convex portion are provided in a region for bonding a substrate to a sealing member and the concave portion and the convex portion are engaged to each other. According to this structure, since an effective distance (effective sealing length) of a flow channel, which is provided between a sealing space where the light-emitting element is provided and an external space outside the sealing space and through which gas (air) passes, can be increased, it is possible to improve a sealing effect. In the meantime, in a case in which a portion of a wiring line, which connects the light-emitting element, which is provided inside of the sealing space, to an external element provided in the external space outside the sealing space is provided in a region for bonding the substrate to the sealing member, if a sharp corner portion exists on the region for bonding the substrate to the sealing member, there is concern in that the wiring line may be easily deteriorated due to the corner portion. When the wiring line is formed, a metal film such as an aluminum film is formed on the substrate by a predetermined method such as, for example, a deposition method or the like, and is then patterned by the predetermined method. However, if the corner portion is sharp, it is difficult for the metal film to form smoothly at the corner portion. In addition, if the corner portion is sharp and a step of the concave portion or convex portion is large, the patterning may not be smoothly performed.

SUMMARY

An advantage of some aspects of the invention is that it provides an organic electroluminescent device capable of obtaining an excellent sealing effect and providing a wiring line connected to a light-emitting element, a method of manufacturing the organic electroluminescent device, and an electronic apparatus.

According to a first aspect of the invention, there is provided an organic electroluminescent device which includes: a first member; a light-emitting element that is formed on the first member; a second member that has a second region bonded to the first region of the first member, and forms a sealing space for sealing the light-emitting element between the first member and the second member. Each of the first and second regions has a flat surface that is provided so as to connect an end portion located at the side of the sealing space to an end portion located at the side of an external space outside of the sealing space, and a wall surface that is provided near the flat surface. The wall surface has a first surface that is provided so as to be parallel to a first direction, and a second surface that is provided so as to be parallel to a second direction different from the first direction.

According to this aspect, since each of the first and second regions has the flat surface that is provided so as to connect the end portion located at the side of the sealing space to the end portion located at the side of the external space outside of the sealing space, the wring line is provided on the flat surface, so that the wiring line can be prevented from being deteriorated. Further, the flow channel formed by the flat surface and the first and second surfaces (flow channel where gas passes between the sealing space and the external space) is bent by providing the wall surface having at least the first and second surfaces near the flat surface, so that an effective sealing length can be increased, thereby obtaining an excellent sealing effect.

In this case, the 'effective sealing length' means an actual distance (length) of the flow channel where the gas passes between the sealing space having the light-emitting element provided therein and the external space outside the sealing space, and means a total length of the flow channel along a straight line for connecting the sealing space and the external space with a minimum distance between the first region and the second region. That is, the 'effective sealing length' means a total length of the flow channel formed between the first region and the second region in plan view. If the effective sealing length is large, the length of the flow channel between the sealing space and the external space increases, so that an amount of an adhesive provided between the first region and the second region increases, thereby obtaining an excellent sealing effect.

Preferably, the first surface is provided so as to be almost parallel to a predetermined direction from the sealing space toward the external space, and the second surface is provided so as to be opposite to at least one of the external space and the sealing space.

According to this aspect, it is possible to increase the effective sealing length by the second surface, and it is possible to control the flow channel where the gas passes between the sealing space and the external space. Therefore, an excellent sealing effect can be obtained.

Preferably, each of the first and second regions has a plurality of concave portions or a plurality of convex portions that are provided so as to correspond to a plurality of predetermined locations, and the wall surfaces includes an inside surface of the concave portion and an outside surface of the convex portion.

According to this aspect, the plurality of concave portions and the plurality of convex portions are provided in the first region and the second region, so that the first surface and the second surface can be smoothly provided.

Preferably, the plurality of concave portions or the plurality of convex portions are provided in a predetermined direction from the sealing space toward the external space, and each of the plurality of concave portions or the plurality of convex portions provided in the predetermined direction is provided at a position deviating from a direction crossing the predetermined direction.

According to this aspect, the first surface and the second surface can be formed in accordance with a predetermined positional relationship. Therefore, an excellent sealing effect can be obtained while preventing the wiring line from being deteriorated.

Preferably, in a state in which the first region and the second region are bonded to each other, the convex portion and the concave portion are provided such that the first region engages with the second region.

According to this aspect, since the convex portion and the concave portion engaged to each other are provided in the first and second regions, it is possible to prevent the positional deviation from being generated between the first member and the second member. Therefore, an excellent sealing effect can be obtained.

Preferably, the wall surface is provided so as to connect the end portion located at the side of the sealing space to the end portion located at the side of the external space, and at least a portion of the wall surface is bent.

According to this aspect, since the flat surface is formed in a crank shape, an excellent sealing effect can be obtained while preventing the wiring line from being deteriorated.

Preferably, the organic electroluminescent device further includes a wiring line that connects the light-emitting element provided in the sealing space to an external element provided in the external space. Preferably, the wiring line is provided on the flat surface.

According to this aspect, the external element and the light-emitting element can be connected to each other by the wiring line.

Preferably, the first member has a flat region that is connected to and is almost equal to the flat surface of the first region in each of the sealing space and the external space in the first region, and the wiring line is provided so as to be continuous to each of the flat surface and the flat region.

According to this aspect, by the corner portion, the wiring line can be prevented from being deteriorated.

According to a second aspect of the invention, there is provided an electronic apparatus including the above-mentioned organic electroluminescent device.

According to this aspect, the light-emitting element can be properly sealed, and the wiring can be prevented from being deteriorated. Therefore, it is possible to achieve an electronic apparatus having high performance.

According to a third aspect of the invention, there is provided a method of manufacturing an organic electroluminescent device. The method includes: forming a flat surface and a wall surface near the flat surface in each of a first region of a first member and a second region of a second member; and bonding the first region of the first member to the second region of the second member so as to form a sealing space for sealing a light-emitting element between the first member and the second member. In addition, the flat surface connects an end portion located at the side of the sealing space to an end portion located at the side of an external space outside of the sealing space, and the wall surface has a first surface that is provided so as to be parallel to a first direction, and a second surface that is provided so as to be parallel to a second direction different from the first direction.

Preferably, during the bonding of the first region to the second region, a concave portion or a convex portion to form the wall surface is provided in each of the first and second regions.

According to this aspect, the concave portion and the convex portion engaged to each other are provided in the first and second regions, so that the first region and the second region can be bonded to each other while preventing positional deviation from being generated between the first member and the second member. An excellent sealing effect can be obtained.

Preferably, during the bonding of the first region to the second region, the first region aligns with the second region by using a connection portion between the first and second surfaces of the wall surface of one of the first region and the second region, and a mark put on the other of the first region and the second region.

According to this aspect, the first region having the first surface and the second region having the second surface can be bonded to each other in accordance with the predetermined positional relationship.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the preferred embodiments of the invention will be described with reference to the accompanying drawings. In the following description, an XYZ rectangular coordinate system is set, and a positional relationship among members will be described with reference to the XYZ rectangular coordinate system. Further, a predetermined direction on a horizontal plane is set to an X-axis direction, a direction orthogonal to the X-axis direction on the horizontal plane is set to a Y-axis direction, and a direction orthogonal to each of the X-axis direction and the Y-axis direction (that is, a vertical direction) is set to a Z-axis direction. Furthermore, the X-axis rotating direction, the Y-axis rotating direction, and the Z-axis rotating direction are set to θX, θY, and θZ, respectively.

First Embodiment

Figure 1:
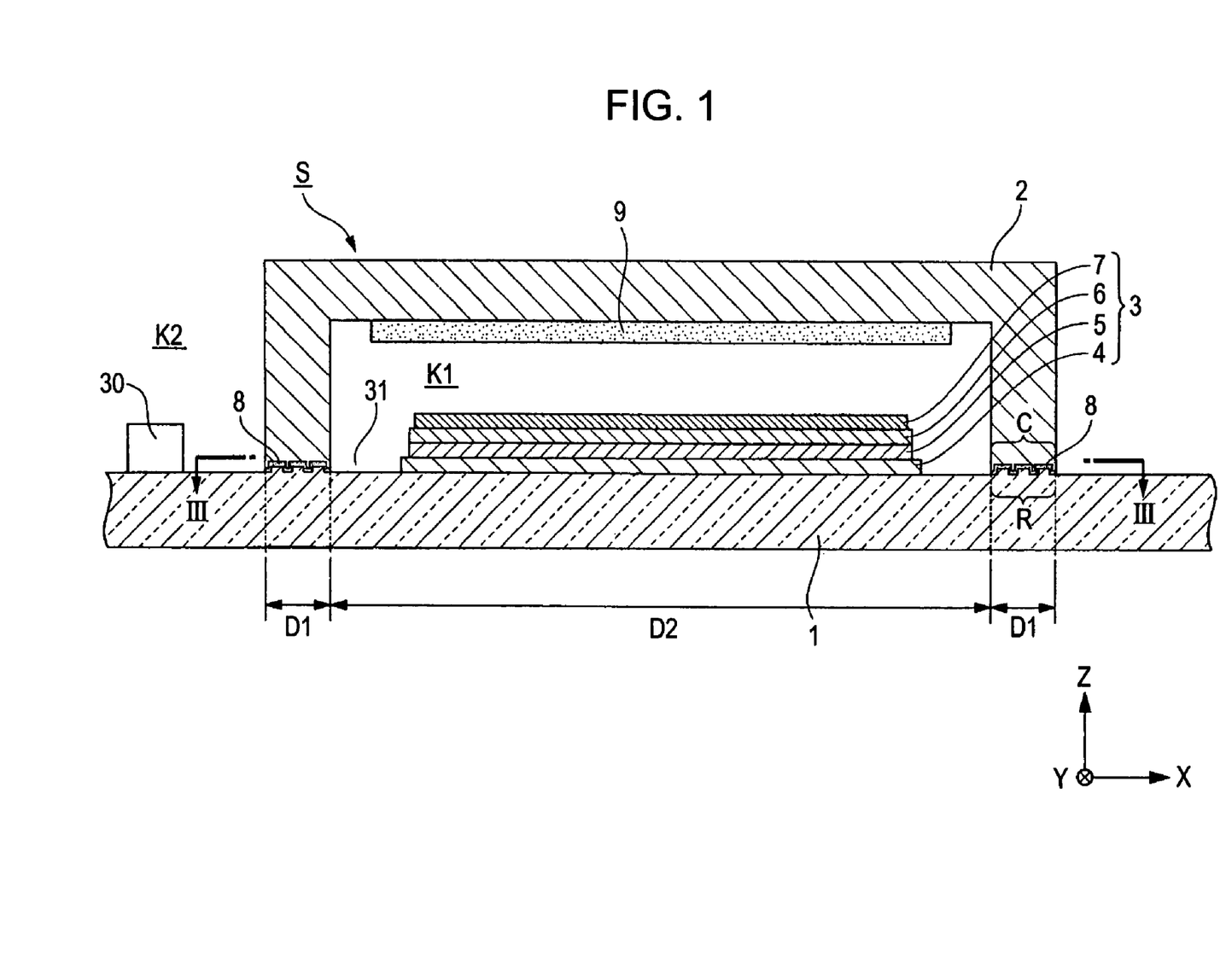
FIG. 1 is a cross-sectional view illustrating essential elements of an organic EL device according to a first embodiment of the invention.

FIG. 1 is a cross-sectional view illustrating essential elements of an organic EL device according to a first embodiment of the invention. In FIG. 1, an organic EL device S includes a substrate (first member) 1, a light-emitting element 3 that is disposed on the substrate 1, and a sealing member (second member) 2 that forms a sealing space K1 together with the substrate 1 so as to seal the light-emitting element 3.

The sealing member 2 is formed in an inverted U shape in the cross-sectional view. The sealing member 2 has a second region C that is opposite to a first region R of the substrate 1 and is bonded to the first region R. The first region R is set so as to correspond to the outside portion of a top surface of the substrate 1 where the light-emitting element 3 is provided. The second region C is set so as to correspond to a bottom surface of the sealing member 2. In addition, the first region R and the second region C are bonded to each other by using an adhesive 8, so that the sealing space K1 for sealing the light-emitting element 3 is formed between the flat substrate 1 and the sealing member 2.

The light-emitting element 3 has an anode 4 that is formed on the substrate 1, a hole transporting layer 5, a light-emitting layer 6, and a cathode 7. The anode 4 of the light-emitting element 3 provided in the sealing space K1 is electrically connected to a driving element 30 provided in an external space K2 outside the sealing space K1 through a wiring line 31. Although not shown in the corresponding drawing, the cathode 7 of the light-emitting element 3 provided in the sealing space K1 is also electrically connected to the driving element 30 provided in the external space K2 through the wiring line 31. The driving element 30 is disposed on the substrate 1, and a portion of the wiring line 31 is disposed on the substrate 1. In addition, a drying agent 9 called a getter agent is provided in the sealing space K1. By using the drying agent 9, the light-emitting element 3 provided in the sealing space K1 can be prevented from being deteriorated due to moisture.

Figure 2:
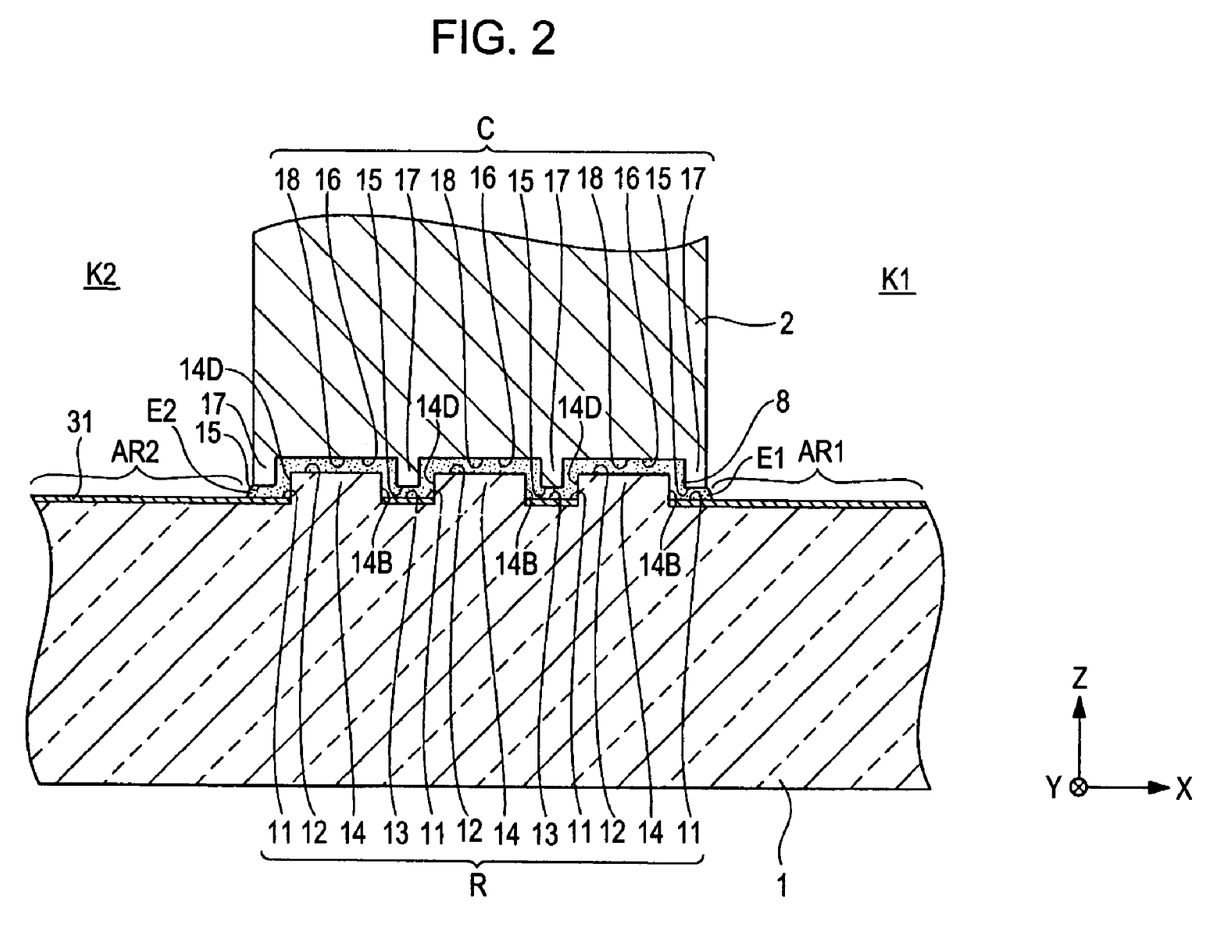
FIG. 2 is an enlarged cross-sectional view of the essential elements of the organic EL device shown in FIG. 1.
Figure 3:
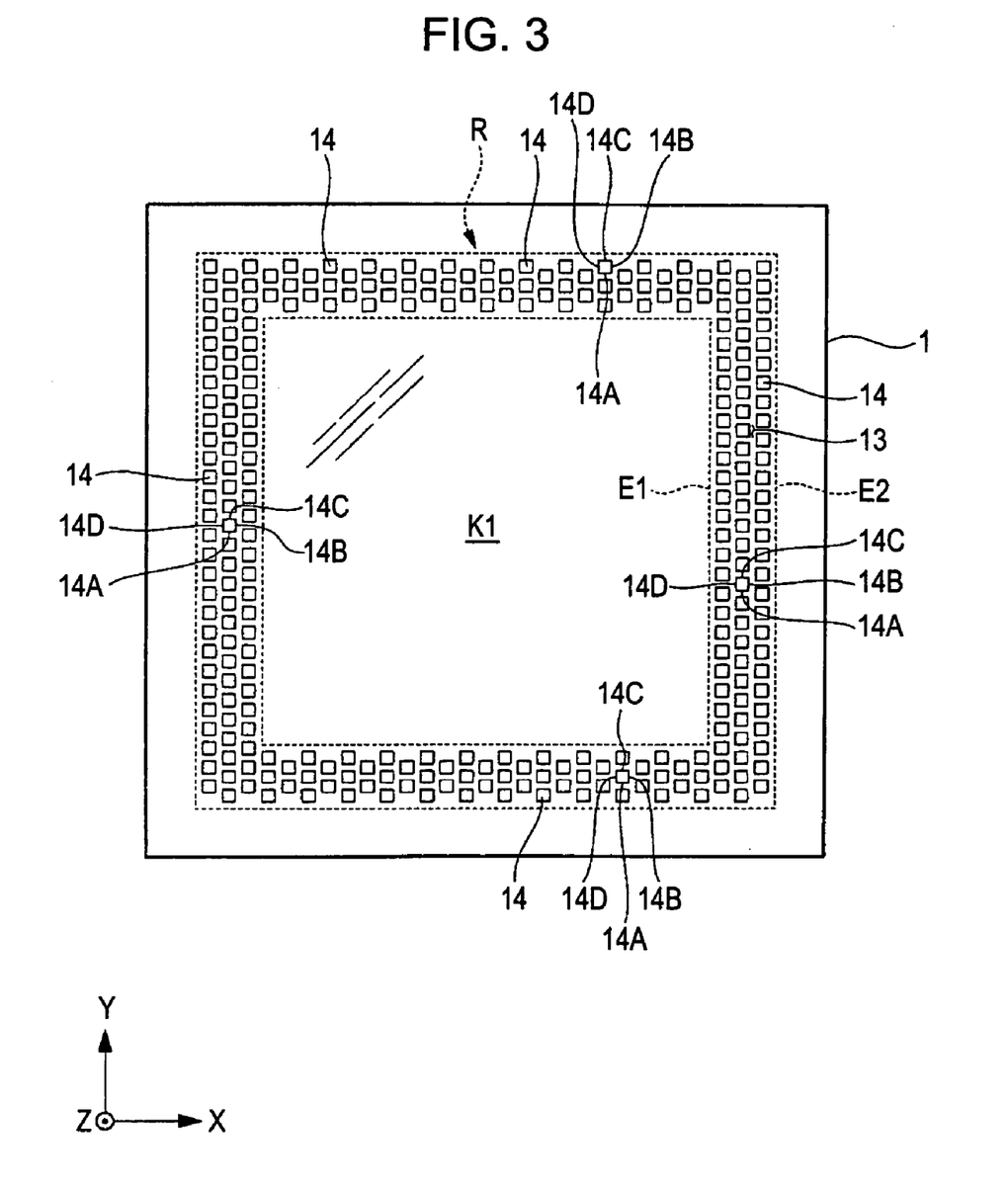
FIG. 3 is a cross-sectional view taken along the line III-III of FIG. 1.
Figure 4:
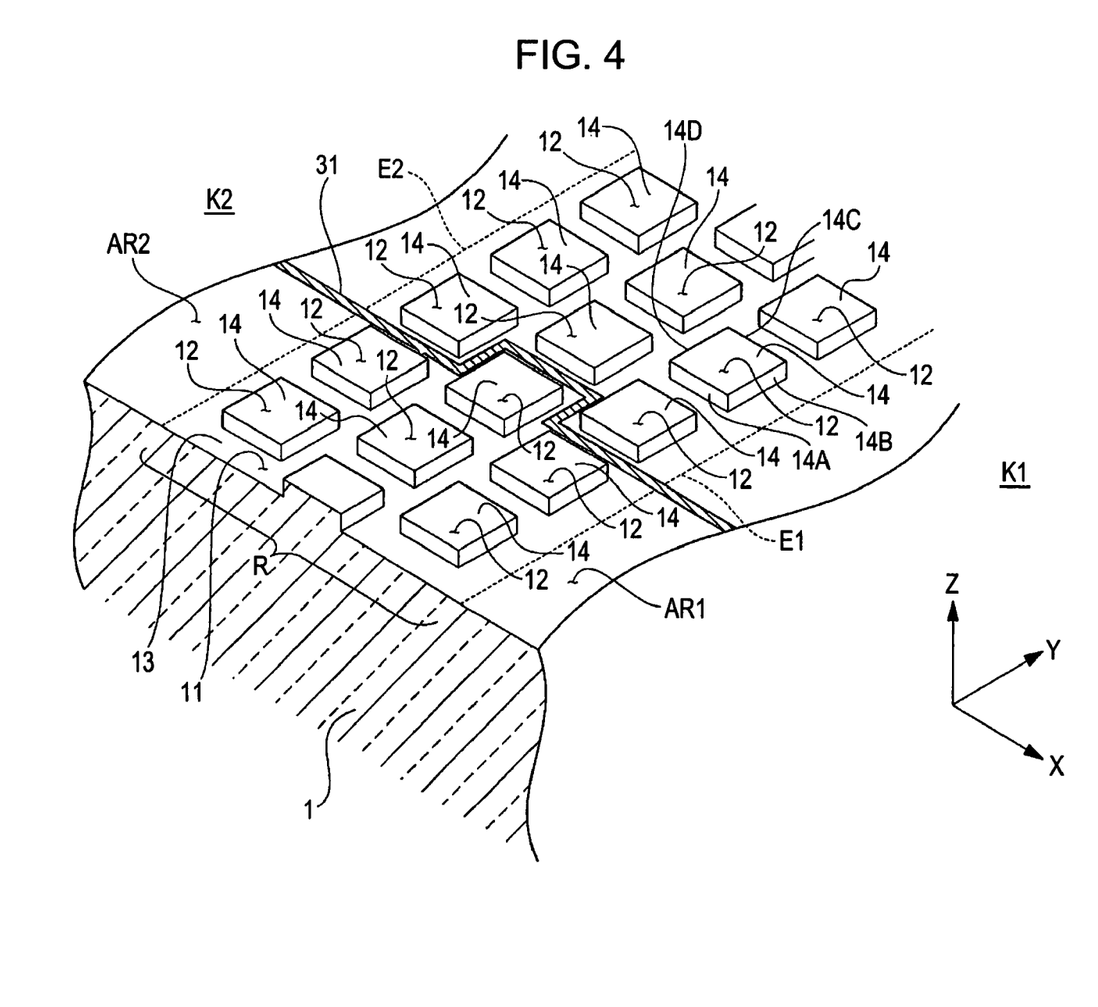
FIG. 4 is a perspective view schematically illustrating a first region of a substrate.

FIG. 2 is an enlarged cross-sectional view of essential elements of the organic EL device provided in the vicinity of the first region R and the second region C, FIG. 3 is a cross-sectional view taken along the line III-III of FIG. 1, and FIG. 4 is a perspective view illustrating the first region R of the sealing space K1 at the −X side. As shown in FIGS. 2 to 4, the first region R has a plurality of convex portions 14 which are respectively provided at a plurality of predetermined locations. Each of the plurality of convex portions 14 is formed in an island shape. A concave portion 13 is provided between two adjacent convex portions 14. A top surface 11 of the concave portion 13 (surface toward +Z side) is a flat surface. The plurality of flat surfaces (top surfaces) 11 are continuously formed such that an end E1 of the first region R located at the sealing space K1 side is connected to an end E2 of the first region R located at the external space K2 side.

Further, the substrate 1 has flat regions AR1 and AR2 which are connected to the corresponding flat surfaces 11 of the first region R at the sealing space K1 side and the external space K2 side of the first region R and which are formed on substantially the same plane as the flat surfaces 11.

Each of the convex portions 14 has a substantially rectangular shape when viewed from a vertical direction with respect to the XY plane. A top surface 12 of the concave portion 14 (surface toward +Z side) is a substantially flat surface. The convex portion 14 has four outside surfaces (wall surfaces) 14A to 14D, and is provided so as to be substantially vertical to the XY plane. The outside surface 14A is a surface toward −Y side and a surface that crosses the Y axis so as to be substantially vertical to the Y axis. The outside surface 14B is a surface toward +X side and a surface that crosses the X axis so as to be substantially vertical to the X axis. The outside surface 14C is a surface toward +Y side and a surface that crosses the Y side so as to be substantially vertical to the Y side. The outside surface 14D is a surface toward −X side and a surface that crosses the X side so as to be substantially vertical to the X side. The outside surfaces 14A to 14D are provided near the flat surfaces 11. In the present embodiment, the outside surfaces 14A to 14D are connected to the flat surfaces 11. Rough regions may be formed between the outside surfaces 14A to 14D and the flat surfaces 11.

The outside surfaces 14A and 14C among the four outside surfaces 14A to 14D of each of the convex portions 14 are provided so as to be substantially parallel to the X-axis direction. In addition, the outside surfaces 14B and 14D among the four outside surfaces 14A to 14D of each of the convex portions 14 are provided so as to be substantially parallel to the Y-axis direction that is different from the X-axis direction. As shown in FIG. 4, in the first region R of the sealing space K1 located at the −X side, the direction from the sealing space K1 toward the external space K2 is parallel to the X-axis direction, and the outside surfaces 14A and 14C are provided so as to be substantially parallel to the direction from the sealing space K1 toward the external space K2 (X-axis direction). Further, in FIG. 4, the outside surface 14B is provided so as to be opposite to the sealing space K1, and the outside surface 14D is provided so as to be opposite to the external space K2.

In FIG. 4, a plurality of columns (three columns) of convex portions 14 are provided in the X-axis direction from the sealing space K1 toward the external space K2. The plurality of convex portions 14 provided in the X-axis direction are at positions deviated from each other in the Y-axis direction that crosses the X-axis direction, respectively. In the first region R of the sealing space K1 located at the −X side shown in FIG. 4, the three columns of convex portions 14 are provided in the X-axis direction.

As shown in FIG. 3, the first region R is provided in a rectangular shape with a predetermined width. The three columns of the convex portions 14 are provided in a width-wise direction of the first region R. Specifically, in the first region R of the sealing space K1 located at the +Y side, the three columns of the convex portions 14 are provided in the Y-axis direction from the sealing space K1 toward the external space K2. Further, the three columns of convex portions 14 provided in the Y-axis direction are at positions deviated from each other in the X-axis direction that crosses the Y-axis direction, respectively. Furthermore, among the four outside surfaces 14A to 14D of the convex portion provided in the first region R of the sealing space K1 located at the +Y side, the outside surfaces 14B and 14D are parallel to the Y-axis direction from the sealing space K1 toward the external space K2, and the outside surface 14A is provided so as to be opposite to the sealing space K1 and the outside surface 14C is provided so as to be opposite to the external space K2.

In the same manner, in the first region R of the sealing space K1 located at the −Y side, the three columns of convex portions 14 are provided in the Y-axis direction from the sealing space K1 toward the external space K2. Further, the three columns of convex portions 14 provided in the Y-axis direction are at positions deviated from each other in the X-axis direction that crosses the Y-axis direction, respectively. Furthermore, among the four outside surfaces 14A to 14D of the convex portion 14 provided in the first region R of the sealing space K1 located at the −Y side, the outside surfaces 14B and 14D are parallel to the Y-axis direction from the sealing space K1 toward the external space K2, and the outside surface 14C is provided so as to be opposite to the sealing space K1 and the outside surface 14A is provided so as to be opposite to the external space K2.

Further, in the first region R of the sealing space K1 located at the +X side, the three columns of convex portions 14 are provided in the X-axis direction from the sealing space K1 toward the external space K2. Further, the three columns of convex portions 14 provided in the X-axis direction are at positions deviated from each other in the Y-axis direction that crosses the X-axis direction, respectively. Furthermore, among the four outside surfaces 14A to 14D of the convex portion 14 provided in the first region R of the sealing space K1 located at the +X side, the outside surfaces 14A and 14C are parallel to the X-axis direction from the sealing space K1 toward the external space K2, and the outside surface 14D is provided so as to be opposite to the sealing space K1 and the outside surface 14B is provided so as to be opposite to the external space K2.

As shown in FIG. 2, the second region C has convex portions 17 each of which protrudes downward (−Z direction), and the other portions other than the convex portions 17 form concave portions 18. A bottom surface 16 of each of the concave portions 18 (surface toward +Z side) is a flat surface. The outside surfaces of the convex portion 17 are provided so as to be substantially vertical to the XY plane. A bottom surface 15 of each of the concave portions 17 (surface toward −Z side) is a flat surface. In a state in which the first region R and the second region C are bonded to each other, the concave portions 13, the convex portions 14, the convex portions 17, and the concave portions 18 are formed such that the first region R and the second region C are engaged to each other. Specifically, each of the convex portions 14 of the first region R engages to each of the concave portions 18 of the second region C, and each of the concave portions 13 of the first region R engages to each of the convex portions 17 of the second region C. Further, when the first region R and the second region C are bonded to each other, the top surface 12 of the convex portion 14 is opposite to the bottom surface 16 of the concave portion 18, the top surface 11 of the concave portion 13 is opposite to the bottom surface 15 of the convex portion 17, and the outside surfaces of the convex portion 14 are opposite to the inside surfaces of the concave portion 18.

The wiring line 31 connects the light-emitting element 3 provided in the sealing space K1 to the driving element 30 provided in the external space K2, and is provided on the flat surface 11 of the first region R. Accordingly, the wiring line 31, which is provided on the flat surfaces 11 formed between the outside surfaces 14A to 14D of the plurality of convex portions 14, is bent along the outside surfaces 14A to 14D, and is formed in a crank shape so as to have a plurality of turning points between the end portions E1 and E2 of the first region R.

In addition, the wiring line 31 is provided so as to be continuous on the flat surfaces 11 and the flat regions AR1 and AR2. As such, since the end portions E1 and E2 do not have steps, it is possible to prevent the wiring line 31 from being deteriorated.

The organic EL device S according to the present embodiment has a type which extracts light emitted from the light-emitting element 3 from the substrate 1 side to the outside of the device, that is, a so-called bottom emission type. The substrate 1 can be formed of a transparent material or a translucent material that can transmit light, for example, transparent glass, quartz, sapphire, or transparent synthetic resin such as polyester, polyacrylate, polycarbonate, polyetherketone or the like.

The anode 4 injects a hole into the hole transporting layer 5 by using an applied voltage. For example, the anode 4 is formed of a transparent conductive film such as ITO (indium tin oxide) or the like.

The hole transporting layer 5 transports and injects the hole of the anode 4 to the light-emitting layer 6, and can be formed with a known material. For example, the hole transporting layer 5 can use materials such as polythiophene, polyaniline, polypyrrole or the like. In particular, the hole transporting layer 5 can use materials such as 3,4-polyethylenedioxythiophene/polystyrenesulfonic acid (PEDOT/PSS) or the like.

The light-emitting layer 6 has a function for coupling a hole injected from the anode 4 via the hole injecting layer 5 with an electron injected from the cathode 7 to generate phosphorescence. The light-emitting layer 6 may be formed with a known material that can emit fluorescence or phosphorescence. For example, as forming materials, the light-emitting layer 6 can use polysilanes such as polyfluorene derivative (PF), (poly)paraphenylenevinylene derivative (PPV), polyphenylene derivative (PP), polyparaphenylene derivative (PPP), polyvinylcarbazole derivative (PVK), polythiophene derivative, polymethyl phenylsilane (PMPS), or the like.

In addition, an electron transporting layer may be provided between the light-emitting layer 6 and the cathode 7. The electron transporting layer serves to inject an electron into the light-emitting layer 6. As forming materials, the electron transporting layer can use metallic complexes of an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyl dicyanoethylene and a derivative thereof, a diphenoxyone derivative, 8-hydroxyquinoline and a derivative thereof.

The cathode 7 is formed of a metal with a small work function capable of effectively injecting an electron into the light-emitting layer 6, for example, metallic materials such as aluminum (Al), magnesium (Mg), gold (Au), silver (Ag), calcium (Ca), or the like.

In addition, if the driving element 30 supplies a driving signal to the light-emitting element 3 through the wiring line 31, a current flows between the anode 4 and the cathode 7, the light-emitting element 3 emits light, and the light is emitted to the external surface of the transparent substrate 1.

The sealing member 2 serves to prevent air from infiltrating into the sealing space K1 from the external space K2, and is formed of glass or quartz, synthetic resin, or a material, such as metal, which has small moisture transmittance. For the glass, for example, soda-lime glass, lead alkali glass, borosilicate glass, aluminosilicate glass, silica glass, or the like may be used. For the synthetic resin, transparent synthetic resin such as polyolefin, polyester, acrylics, polycarbonate, polyetherketone, or the like may be used. For the metal, aluminum or stainless steel may be used.

For the drying agent 9, silica gel, zeolite, activated carbon, calcium oxide, germanium oxide, barium oxide, magnesium oxide, phosphorus pentoxide, calcium chloride, or the like may be used.

The adhesive 8 is provided over the entire first region R (or the second region C) that is set to have a rectangular shape. The adhesive 8 is not particularly limited as long as it can sustain the stable adhesive strength and have excellent airtightness. For the adhesive 8 in the present embodiment, a photo-curable epoxy resin, which hardens by irradiating ultraviolet (UV) light, is used.

Method of Manufacturing Organic EL Device

Figure 5:
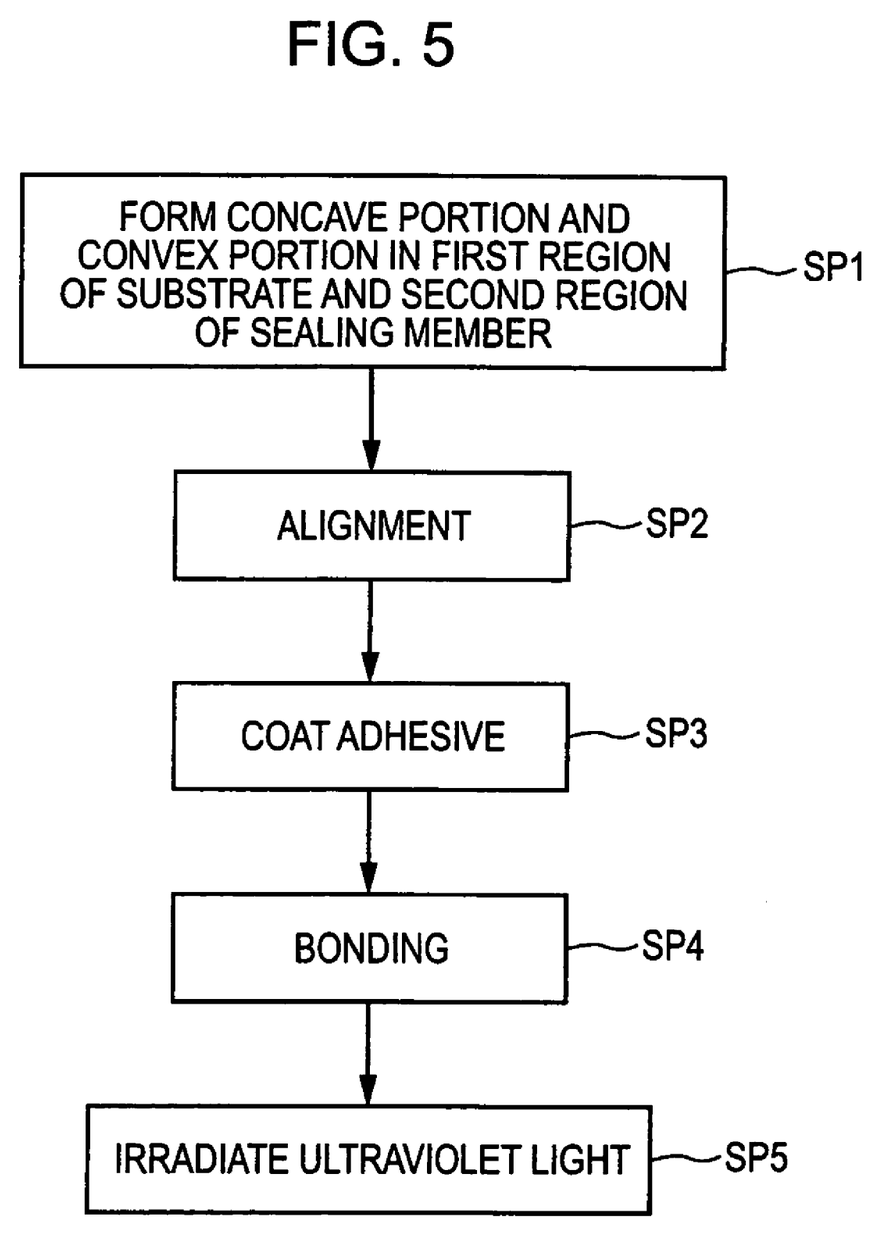
FIG. 5 is a flowchart illustrating a method of manufacturing the organic EL device.

Next, a method of forming the sealing portion of the organic EL device S, which is a portion of a process of manufacturing the organic EL device S having the above-mentioned structure, will be described with reference to a flowchart of FIG. 5, and schematic diagrams shown in FIGS. 6 to 10.

The manufacturing process, which will be described in detail below, is performed by using a manufacturing device 100. The manufacturing device 100 includes a machining device 40 for machining each of the first region R of the substrate 1 and the second region C of the sealing member 2, a stage 80 that can support the substrate 1, an alignment device 50 that aligns the first region R of the substrate 1 and the second region C of the sealing member 2 with each other, a coater 60 that coats the adhesive 8 on the substrate 1, and an irradiation device 70 that can emit light at a predetermined wavelength. In addition, a portion of the manufacturing process, which will be described in detail below, is performed under an inert gas atmosphere such as nitrogen gas or argon gas in order to prevent an optical element 3 from being deteriorated.

First, using the machining device 40, the manufacturing device 100 forms concave portions 13 and convex portions 14 in the first region R of the substrate 1 (step SP1).

Figure 6A:
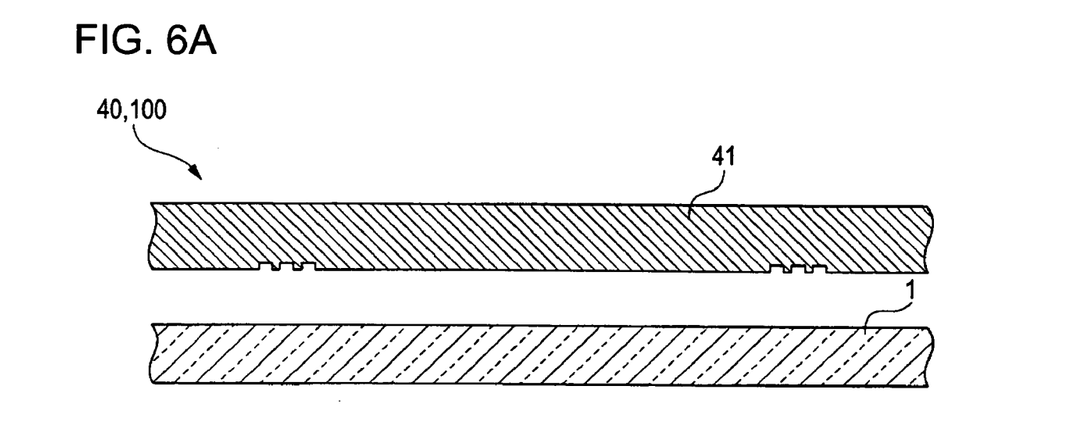
FIG. 6 is a diagram schematically illustrating a method of manufacturing the organic EL device.
Figure 6B:
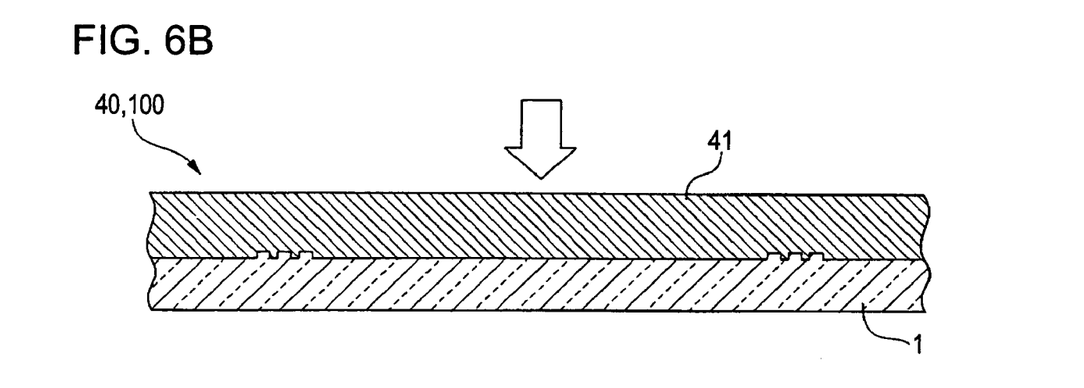
Figure 6C:
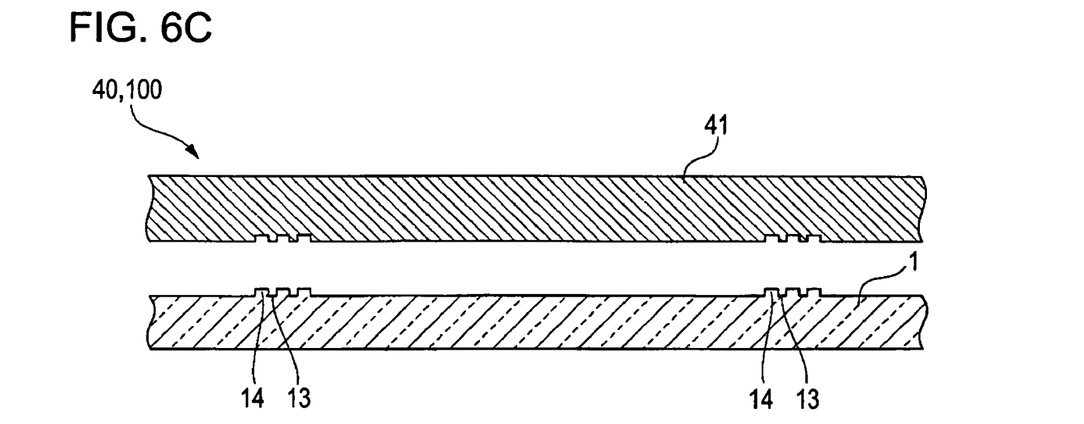

FIG. 6 is a diagram illustrating an aspect in which the concave portions 13 and convex portions 14 are formed in the first region R of the substrate 1 by using the machining device 40. The machining device 40 according to the present embodiment includes a nano-imprint device which is a mold 41 having predetermined shape. First, as shown in FIG. 6A, the machining device 40 heats the mold 41 and the substrate 1 to a glass transition temperature of the substrate 1 or more. Next, as shown in FIG. 6B, the machining device 40 presses the mold 41 on the substrate 1 and holds this state for a predetermined time. Next, as shown in FIG. 6C, the machining device 40 cools down the mold 41 and the substrate 1 to the glass transition temperature of the substrate 1 or less, and allows the mold 41 and the substrate 1 to be separated from each other. Thereby, in the first region R of the substrate 1, the concave portions 13 and the convex portions 14 with predetermined shapes, that is, the flat surfaces 11 and the outside surfaces 14A to 14D are formed. Using the machining device 40, the manufacturing device 100 forms the flat surfaces 11 such that the end E1 located at the sealing space K1 side is connected to the end E2 located at the external space K2 side, and forms the outside surfaces 14A to 14D such that they face toward different directions-from one another.

Figure 7:
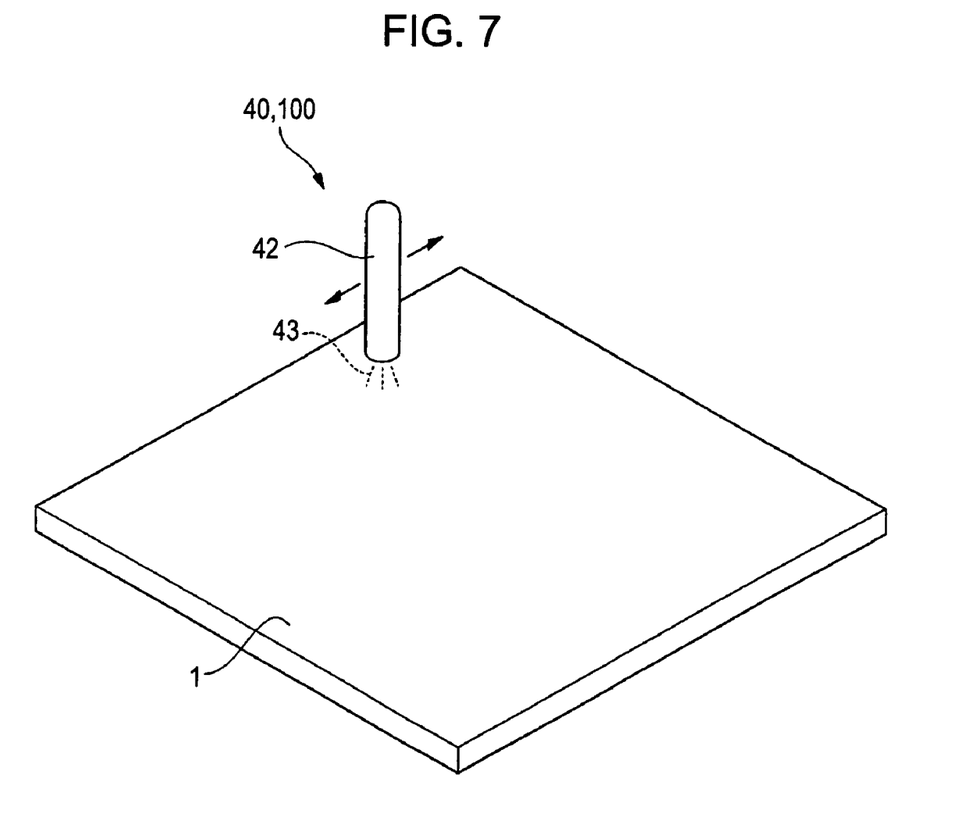
FIG. 7 is a diagram schematically illustrating a method of manufacturing the organic EL device.

In addition, the machining device 40 may have a microblasting device. As schematically shown in FIG. 7, the microblasting device performs machining by making minute abrasive grains 43 accelerated by carrier gas such as compressed air ejected from a nozzle 42 and making the minute abrasive grains 43 collide against the substrate 1.

Further, the method of forming the concave portions 13 and the convex portions 14 with respect to the substrate 1 is not limited to the above-mentioned method, but may use any one of the known methods including, for example, an etching method, a laser machining method, a drilling method or the like.

In the same manner, the machining device 40 machines the second region C that is set on the lower end surface of the sealing member 2, and forms the convex portions 17 and the concave portions 18 in the second region C. When the first region R and the second region C are bonded to each other, the manufacturing device 100 forms the concave portions 13, the convex portions 14, the convex portions 17, and the concave portions 18 such that the first region R engages to the second region C.

Next, the manufacturing device 100 forms the wiring line 31 on the substrate 1. When the wiring line 31 is formed on the substrate 1, the manufacturing device 100 forms a metal film made of aluminum or the like on the substrate 1 using a predetermined method such as, for example, a deposition method, a sputtering method or the like. The manufacturing device 100 can form the metal film on the flat surface 11 of the first region R without generating irregularities.

Next, the manufacturing device 100 patterns the metal film using a predetermined method such as a photolithography method or the like. The manufacturing device 100 easily can pattern the metal film provided on the flat surface 11. In this way, as shown in FIG. 4, a portion of the wiring line 31 is formed in a crank shape along the flat surfaces 11 of the first region R.

Figure 8A:
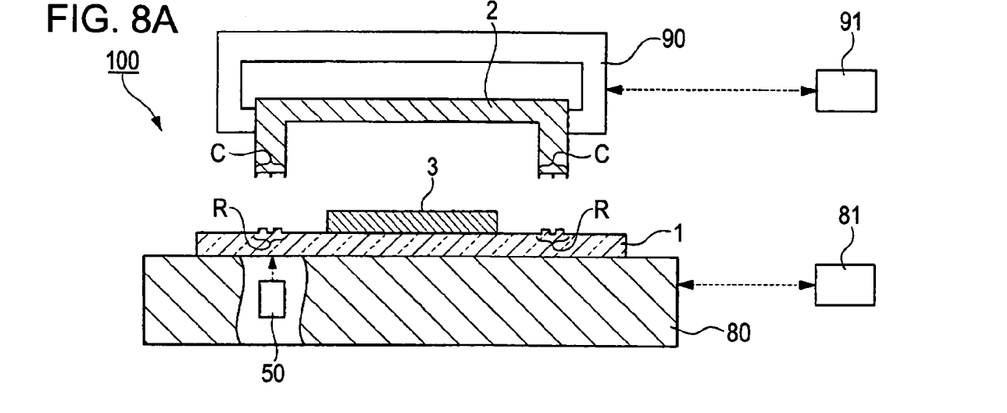
FIG. 8 is a diagram schematically illustrating a method of manufacturing the organic EL device.

Next, the manufacturing device 100 disposes the light-emitting device 3 including the anode 4 and the cathode 7 on the substrate 1, and mounts the substrate 1 including the light-emitting element 3 on the stage 80, as shown in FIG. 8A. The stage 80 can move in all of the X-axis direction, the Y-axis direction, the Z-axis direction, the θX direction, the θY direction, and the θZ direction. The stage 80 holds the substrate 1 by using a vacuum chuck or the like.

In addition, the manufacturing device 100 carries the sealing member 2 to the vicinity of the stage 80 using a predetermined carrying device 90. The carrying device 90 allows the sealing member 2 to be opposite to the substrate 1 mounted on the stage 80. The manufacturing device 100 has a first measuring instrument 81 that can measure locations of the stage 80 holding the substrate 1 in the X-axis direction, the Y-axis direction, the Z-axis direction, the θX direction, the θY direction, and the θZ direction, and a second measuring instrument 91 that can measure locations of the carrying device 90 holding the sealing member 2 in the X-axis direction, the Y-axis direction, the Z-axis direction, the θX direction, the θY direction, and the θZ direction. The manufacturing device 100 can measure the locations of the substrate 1 and the sealing member 2 using the first and second measuring instruments 81 and 91. The manufacturing device 100 aligns the first region R and the second region C with each other using the alignment device 50 while monitoring the measured results of the first and second measuring instruments 81 and 91 (step SP2).

Figure 9A:
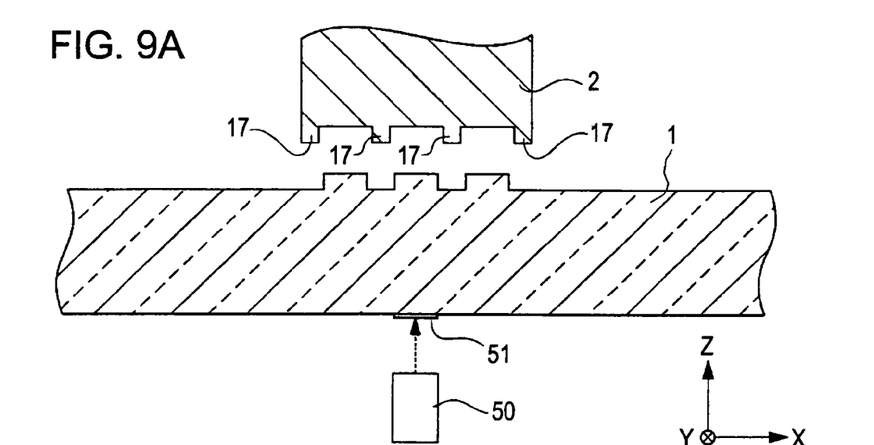
FIG. 9 is a diagram schematically illustrating a method of manufacturing the organic EL device.
Figure 9B:
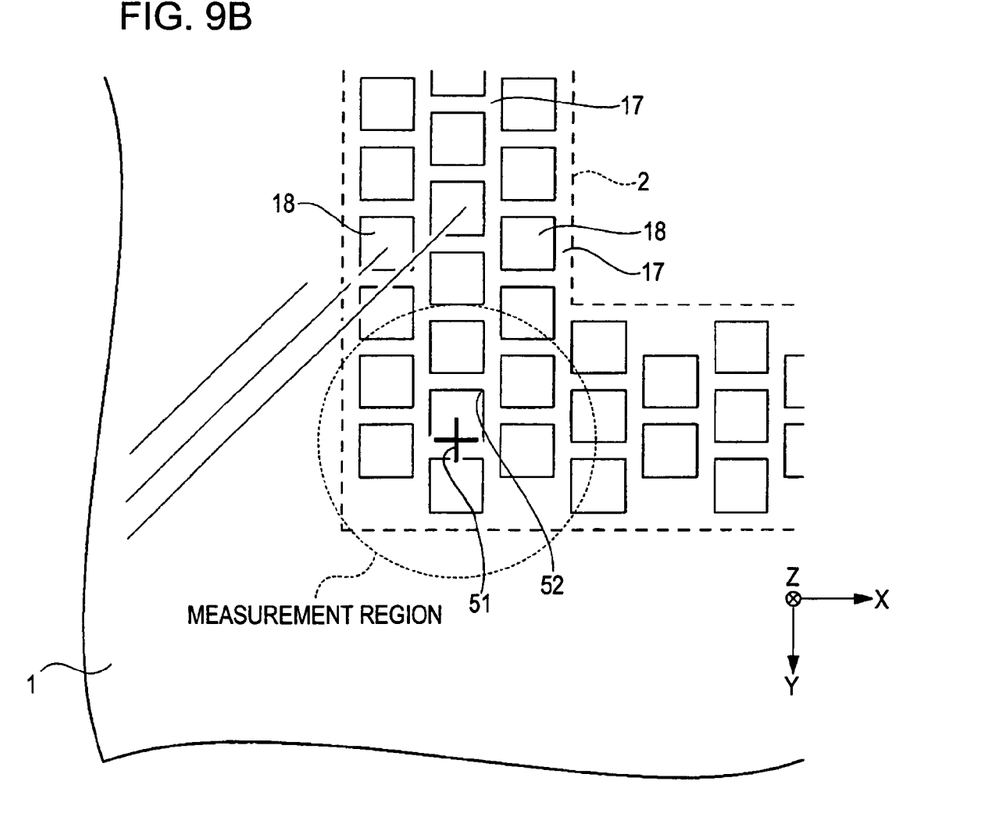

FIG. 9 is a diagram illustrating an aspect in which the alignment device 50 makes the first region R and the second region C aligned with each other. The alignment device 50 has a CCD camera and a predetermined measuring region. A mark 51 is put on a bottom surface of the substrate 1 corresponding to the first region R. In addition, the mark 51 may be put on the first region R of the top surface of the substrate 1. The CCD camera of the alignment device 50 is provided in the stage 80, and the mark 51 put on the bottom surface of the substrate 1 can be viewed from the bottom side (−Z side). In addition, as shown in FIG. 9B, a connection portion between an outside surface of the convex portion 17 vertical to the X axis and an outside surface of the convex portion 17 vertical to the Y axis serves as a mark. In the following description, a connection portion between two outside surfaces toward different directions is simply referred to as 'an edge portion 52'. In the present embodiment, since the substrate 1 is transparent, the CCD camera of the alignment device 50 can observe the edge portion 52 from the bottom side of the substrate 1 at the same time as the mark 51. Further, a plurality of edge portions 52 are respectively provided at a plurality of predetermined locations of the second region C, and each of the marks 51 is corresponding to at least two of the plurality of edge portions 52. Further, the plurality of CCD cameras of the alignment device 50 are provided according to the plurality of marks 51.

Using the alignment device 50, the manufacturing device 100 observes the edge portion 52 of the convex portion 17 of the second region C and the mark 51 of the first region R at the same time. As described above, the alignment device 50 has the plurality of CCD cameras. When the mark 51 and the edge portion 52 align with each other on a measuring region of each of the plurality of CCD cameras, locations of the mark 51, the concave portion 13, the convex portion 14, the convex portion 17, and the concave portion 18 or the like are set in advance such that the first region R and the second region C have predetermined positional relationships. That is, when the mark 51 and the edge portion 52 align with each other on the measuring region of the alignment device 50, the concave portion 13 and the convex portion 14 in the first region R engage with the convex portion 17 and the concave portion 18 in the second region C. The manufacturing device 100 moves relative to the stage 80 holding the substrate 1 and the carrying device 90 holding the sealing member 2 while monitoring the output of each of the first and second measuring instruments 81 and 91. As such, the manufacturing device 100 makes the mark 51 and the edge portion 52 aligned to each other on the measuring region of the alignment device 50. The manufacturing device 100 stores the positions of the stage 80 and the carrying device 90 when the mark 51 aligns with the edge portion 52, that is, the measured results of the first and second measuring instruments 81 and 91.

In addition, instead of using the edge portion of the convex portion 17, a positioning mark may be put on each of the substrate 1 and the sealing member 2, so that the first region R may align with the second region C using these marks.

Figure 8B:
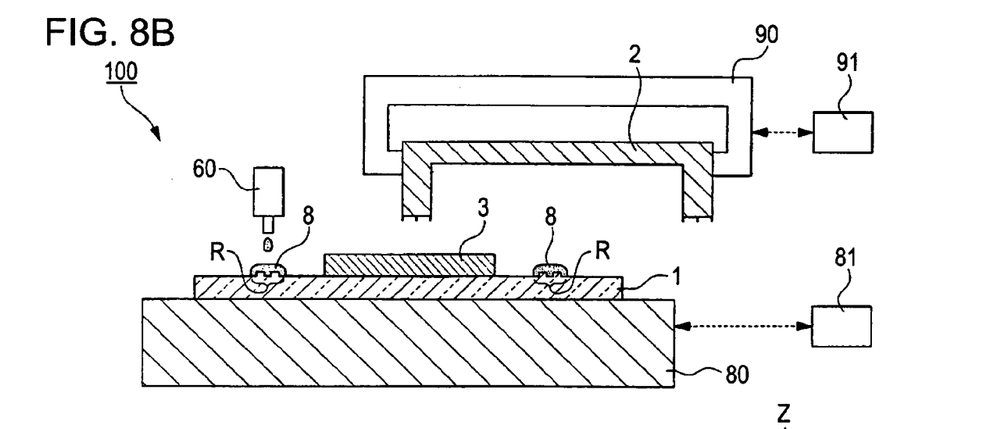

Next, as shown in FIG. 8B, after evacuating the carrying device 90 having held the sealing member 2 to a predetermined location, the manufacturing device 100 coats the adhesive 8 on to the first region R of the substrate 1 held on the stage 80 using the coater 60 (step SP3).

The coater 60 has a liquid droplet ejecting device that quantitatively ejects the liquid adhesive 8. A dispenser or inkjet device may be used as the liquid droplet ejecting device. The coater 60 is provided so as to move in all of the X-axis direction, the Y-axis direction, the Z-axis direction, the θX direction, the θY direction, and the θZ direction. The coater 60 ejects the adhesive 8 onto the substrate 1 held on the stage 80 while relatively moving with respect to the substrate 1, and arranges (coats) the adhesive 8 on the substrate 1 with a predetermined pattern. In addition, when the adhesive 8 is coated on the substrate 1, the adhesive 8 may be coated on the substrate 1 while moving the stage 80, and the adhesive 8 may be coated on the substrate 1 while moving each of the coater 60 and the stage 80.

After coating the adhesive 8 on the first region R of the substrate 1, the manufacturing device 100 moves the stage 80 and the carrying device 90 while monitoring the output of each of the first and second measuring instruments 81 and 91, such that the first region R and the second region C have predetermined positional relationships. As described above, in step SP2, the manufacturing device 100 stores the positions of the stage 80 and the carrying device 90 when the mark 51 aligned with the edge portion 52 on the measuring region of the alignment device 50, that is, the measured results of the first and second measuring instruments 81 and 91 when the first region R and the second region C have the predetermined positional relationships. Accordingly, the manufacturing device 100 adjusts the positions of the stage 80 and the carrying device 90 such that the output (measured result) of each of the first and second measuring instruments 81 and 91 is equal to the stored information while monitoring the output of each of the first and second measuring instruments 81 and 91. As a result, it is possible to allow the first region R and the second region C to have the predetermined positional relationships. As described above, the predetermined positional relationships are positional relationships by which the concave portion 13 and the convex portion 14 in the first region R can engage with the concave portion 18 and the convex portion 17 in the second region C.

Figure 8C:
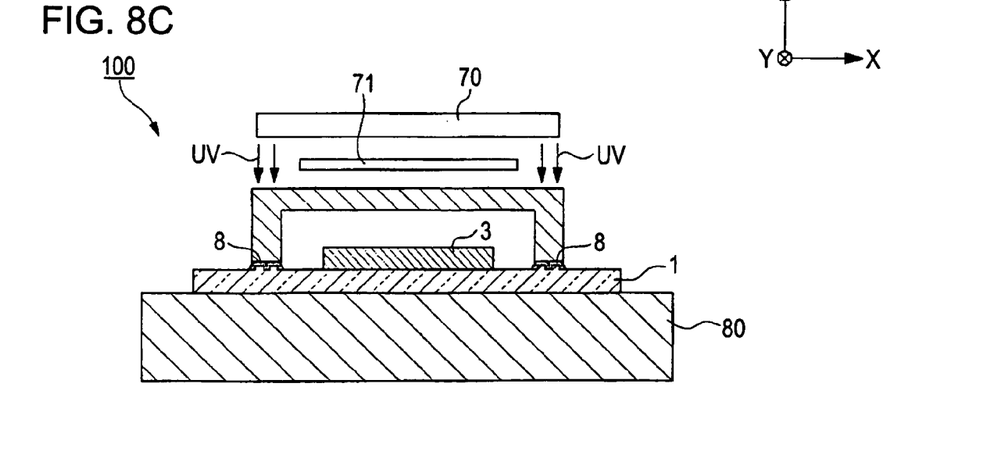

Next, as shown in FIG. 8C, the manufacturing device 100 moves the second region C of the sealing member 2 held on the carrying device 90 closely to the first region R of the substrate 1 held on the stage 80, and then presses on the substrate 1 and the sealing member 2 with a predetermined force such that the first region R and the second region C are bonded to each other by the adhesive 8 (step SP4). When the first region R and the second region C are bonded to each other, in the manufacturing device 100, the first region R and the second region C are aligned with each other by using the edge portion 52 of the convex portion 17 provided in the second region R and the marker 51 provided in the first region R. Accordingly, the first region R and the second region C may be bonded to each other according to predetermined positional relationships.

Next, using the irradiation device 70, the manufacturing device 100 irradiates light having a predetermined wavelength (ultraviolet light) onto the adhesive 8 (step SP5). In FIG. 8C, the irradiation device 70 irradiates light from the upper side of the sealing member 2. At this time, when the sealing member 2 is transparent, the light emitted from the irradiation device 70 can propagate to the adhesive 8. In this case, a light shielding mask 71 can be disposed at a predetermined location such that the light emitted from the irradiation device 70 is not irradiated onto the light-emitting element 3. In addition, the light emitted from the irradiation device 70 may be guided to the vicinity of the adhesive 8 through an optical fiber or the like. In addition, when the sealing member 2 is opaque, the irradiation device 70 irradiates light onto the adhesive 8 from the bottom side or sides of the substrate 1, so that the adhesive 8 can harden. Also in this case, a light shielding mask 71 can be disposed at a predetermined location such that the light emitted from the irradiation device 70 is not irradiated onto the light-emitting element 3.

As described above, the flat surfaces 11, which connect the end portion E1 located at the sealing space K1 side to the end portion E2 located at the external space K2 side, are provided in the first region R, and the flat surfaces 15 corresponding to the flat surfaces 11 are provided in the second region C. Therefore, it is possible to prevent the wiring line 31 from being deteriorated by providing the wiring line 31 on the flat surface 11. In addition, the outside surfaces, which are substantially parallel to the direction from the external space K2 toward the sealing space K1, and the outside surfaces, which are opposite to the external space K2 or the sealing space K1, are provided near the flat surfaces 11 and 15. Therefore, a flow channel (flow channel between the sealing space K1 and the external space K2), which is formed by the flat surfaces and the outside surfaces of the convex portions, can meander in the XY direction, so that an effective sealing length can be increased, thereby obtaining an excellent sealing effect. In the present embodiment, the flat surfaces 11 of the first region R, the adjacent outside surfaces 14A and 14C of the convex portion 14, and the flat surfaces (bottom surfaces) 16 and inside surfaces of the concave portions 18 of the second region C engaging with the convex portions 14 form the flow channel.

Further, since the effective sealing length can be increased, even though the width D1 of the sidewall portion of the sealing member 2 and the width D1 of each of the first and second regions R and C are decreased as shown in FIG. 1, it is possible to obtain an excellent sealing effect. Accordingly, a width D2 of a light extracting region and an area of the light extracting region can be increased by decreasing the width D1.

Furthermore, since the concave portions 13 and 18 and the convex portions 14 and 17 are engaged to each other are provided in the first region R and the second region C, the positional deviation between the substrate 1 and the sealing member 2 can be prevented, so that an excellent sealing effect can be achieved.

In the present embodiment, the convex portion 14 of the first region R is provided in an island shape. However, the concave portion 13 of the first region R may be provided in an island shape, so that the top surface (flat surface) 12 of the convex portion 14 may be provided so as to connect the end portion E1 located at the sealing space K1 side to the end portion E2 located at the external space K2 side. In this case, a flow channel between the sealing space K1 and the external space K2 is formed by the top surfaces 12 of the convex portions 14 in the first region R and the flat surfaces 16 and the inside surfaces (wall surfaces) of the concave portions 18 in the second region C.

Further, in the present embodiment, the convex portion 14 of the first region R has a substantially rectangular shape in plan view, and the flow channel is bent at an angle of 90 degrees. However, the angle at which the flow channel is bent does not need to be 90 degrees, but may be any angle. That is, the convex portion 14 may have a shape of a rhombus in plan view. In addition, the convex portion 14 may have any shape, such as a triangular shape, a circular shape or the like, in plan view. In the second region C, the concave portions and the convex portions, which are engaged to the concave portions and the convex portions of the first region R, are provided.

In the present embodiment, the flow channel formed by the flat surfaces and the outside surfaces of the convex portions is bent in the XY direction, and the wiring line 31 is also bent in the XY direction along the flow channel, so that each of the flow channel and the wiring line 31 is formed in a crank shape. However, the wiring line 31 is not necessarily bent. For example, in a case in which a distance between adjacent convex portions 14 increases and the width of the flow channel in the XY direction increases, even though the wiring line 31 is linearly provided, it is possible to connect the end portion E1 of the first region R located at the sealing space K1 side to the end portion E2 of the first region R located at the external space K2 side by using the wiring line 31.

In the present embodiment, the adhesive 8 is coated on the first region R of the substrate 1. However, the invention is not limited thereto. That is, after the adhesive 8 is coated on the second region C of the sealing member 2, the substrate 1 and the sealing member 2 may be bonded to each other, and the adhesive 8 may be coated on each of the first region R and the second region C.

In the present embodiment, the carrying device 90 holds the sealing substrate 2 and presses on the substrate 1. However, the stage 80 may hold the substrate 1 and may press on the sealing substrate 2.

In the present embodiment, the photo-curable adhesive is used as the adhesive 8. However, any adhesive capable of bonding the substrate 1 to the sealing member 2 may be used, and a thermosetting adhesive or an EB-curable (electron beam) adhesive may be used.

Second Embodiment

Figure 10:
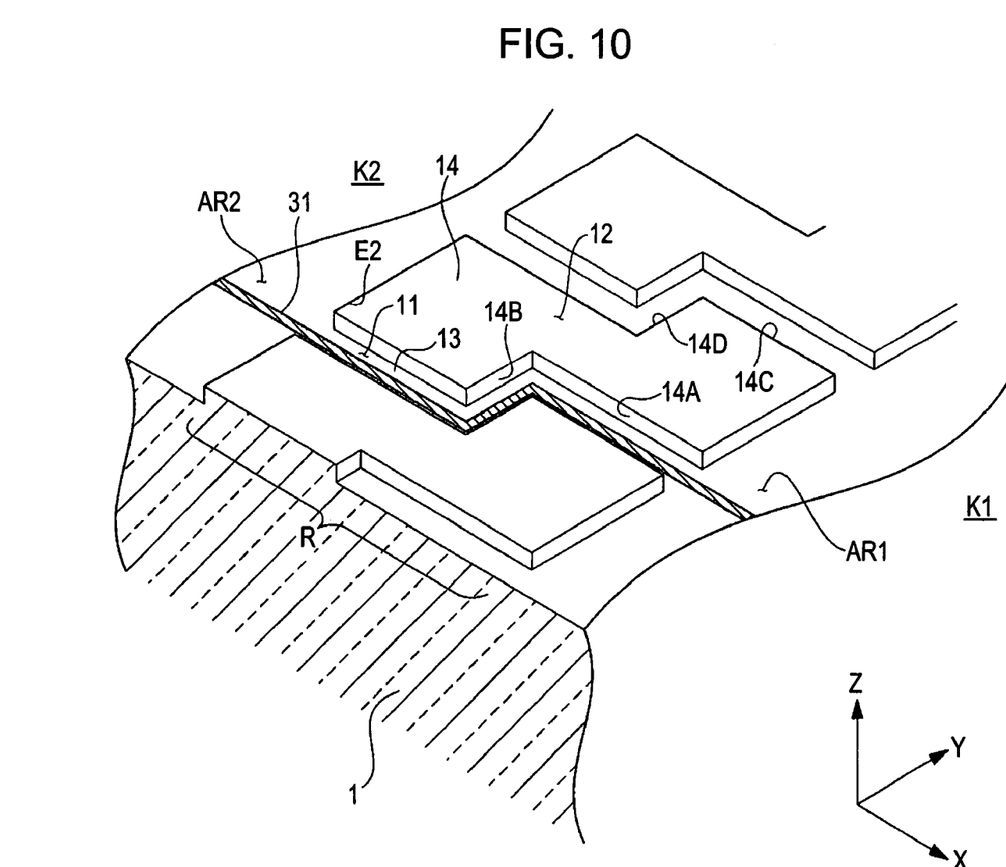
FIG. 10 is an enlarged cross-sectional view of essential elements of an organic EL device according to a second embodiment of the invention.

Next, a second embodiment of the invention will be described with reference to FIG. 10. In the following description, the same constituent element as those of the first embodiment will be denoted by the same reference numerals, and the description thereof will be simplified or omitted. In FIG. 10, a convex portion 14 with outside surfaces 14A and 14C, which connects an end portion E1 located at a sealing space K1 side to an end portion E2 located at an external space K2 side, is provided in a first region R. Further, portions of the outside surfaces 14A and 14C are bent. Furthermore, a flow channel, which is bent in an XY direction, is formed by a flat surface 11 of the first region R, the outside surfaces 14A and 14C of the convex portion 14 are adjacent to each other, and a flat surface 16 and inside surfaces of a concave portion 18 of a second region C engaged to the convex portion 14. In addition, a concave portion 18 and a convex portion 17, which engage with the convex portion 14 and the concave portion 13 in the first region R, are provided in the second region C. In addition, the wiring line 31 is provided on the flat surface 11 in a state in which it curves along shapes of the outside surfaces 14A and 14C.

Even in this structure, the flow channel (flow channel between the sealing space K1 and the external space K2), which is formed by the flat surfaces and the outside surfaces of the convex portions, meanders in the XY direction, so that an effective sealing length can be increased, thereby obtaining an excellent sealing effect.

Also in the present embodiment, the wiring line 31 is not necessarily bent, and may have a linear shape. In addition, in the present embodiment, the angle at which the outside surfaces 14A and 14C are bent does not need to be 90 degrees but may be any angle. In addition, the wiring line 31 may be provided on the top surface 12 of the convex portion 14.

Furthermore, in the first and second embodiments, the concave portions (convex portions) are provided in the substantially entire region of the first region R, the convex portions (concave portions) are substantially provided in the entire region of the second region C, and the first region R and the second region C engages with each other substantially over the entire region. However, the invention is not limited thereto, but the concave portions (convex portions) may be provided in a portion of the first region R, and the convex portions (concave portions) may be provided in a portion of the second region C. In addition, regions where the first region R and the second region C engaged to each other may be portions of the first region R and the second region C.

Electronic Apparatus

Next, an example of an electronic apparatus, which has the organic EL device S according to the above-mentioned embodiments, will be described.

Figure 11A:
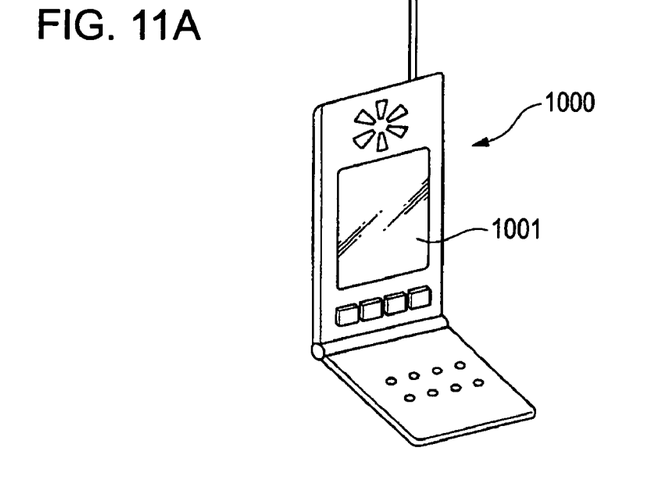
FIG. 11A is a perspective view illustrating a cellular phone which is an example of an electronic apparatus having an organic EL device.

FIG. 11A is a perspective view illustrating an example of a cellular phone. In FIG. 11A, reference numeral 1000 indicates a main body of the cellular phone, and reference numeral 1001 indicates a display portion using the above-mentioned organic EL device S.

Figure 11B:
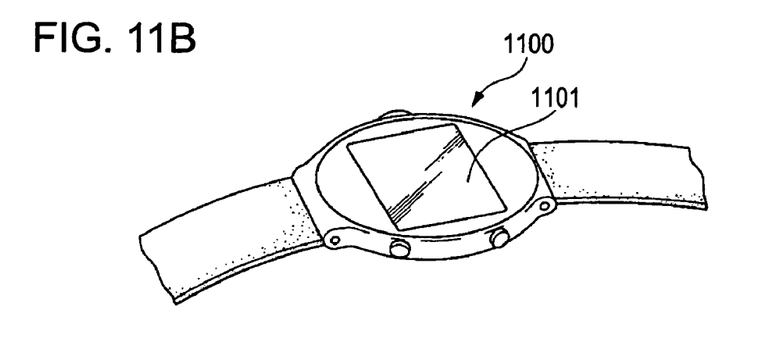
FIG. 11B is a perspective view illustrating a wristwatch which is an example of an electronic apparatus having an organic EL device.

FIG. 11B is a perspective view illustrating an example of a wristwatch-type electronic apparatus. In FIG. 11B, reference numeral 1100 indicates a main body of the wristwatch, and reference numeral 1101 indicates a display portion using the above-mentioned organic EL device S.

Figure 11C:
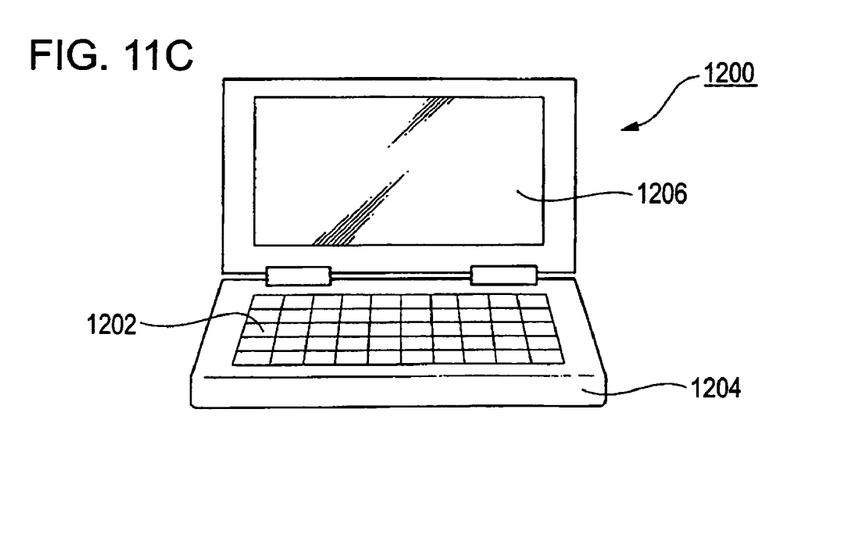
FIG. 11C is a perspective view illustrating a portable information processing device which is an example of an electronic apparatus having an organic EL device.

FIG. 11C is a perspective view illustrating an example of a portable information processing device, such as a word processor, a personal computer or the like. In FIG. 11C, a reference symbol 1200 indicates an information processing device, reference numeral 1202 indicates an input unit such as a keyboard or the like, reference numeral 1204 indicates a main body of the information processing device, and reference numeral 1206 indicates a display portion using the above-mentioned organic EL device S.

Since each of the electronic apparatuses shown in FIGS. 11A to 11C includes the organic EL device S according to the above-mentioned embodiments, it is possible to achieve an electronic apparatus having an organic EL device of a long lifespan as a display portion.

Further, the technical range of the invention is not limited to the above-mentioned embodiments, but various modifications and changes can be made without departing from the spirit and scope of the invention.

For example, the above-mentioned embodiments have been described while using a type in which light emission from the light-emitting element 3 is performed from the external surface side through the substrate 1, that is, a so-called bottom emission type. However, the invention can be applied to a so-called top emission type in which light emission from the light-emitting element 3 is performed from the side opposite to the substrate 1 through the sealing member 2. In this case, for a forming material of the sealing member 2 or the cathode 7, a transparent or translucent material that can extract light is used.

In addition, the organic EL device according to the embodiments of the invention can be used in the display device shown in FIG. 11, and can be applied to a light-emitting device, such as an optical recording head which can irradiate light onto a photoreceptor.

The entire disclosure of Japanese Patent Application No. 2005-062012, filed Mar. 7, 2005 is expressly incorporated by reference herein.

What is claimed is:

1. An organic electroluminescent device comprising:
a first member:
a light-emitting element that is formed on the first member;
a second member that has a second region bonded to a first region of the first member, and forms a sealing space for sealing the light-emitting element between the first member and the second member,
wherein each of the first and second regions has a flat surface that is provided so as to connect an end portion located at the side of the sealing space to an end portion located at the side of an external space outside of the sealing space, and a wall surface that is provided near the flat surface, and
the wall surface has a first surface that is provided so as to be parallel to a first direction, and a second surface that is provided so as to be parallel to a second direction different from the first direction.

2. The organic electroluminescent device according to claim 1,
wherein the first surface is provided so as to be almost parallel to a predetermined direction from the sealing space toward the external space, and
the second surface is provided so as to be opposite to at least one of the external space and the sealing space.

3. The organic electroluminescent device according to claim 1,
wherein each of the first and second regions has a plurality of concave portions or a plurality of convex portions that are provided so as to correspond to a plurality of predetermined locations, and
the wall surface includes an inside surface of the concave portion or an outside surface of the convex portion.

4. The organic electroluminescent device according to claim 3,
wherein the plurality of concave portions or the plurality of convex portions are provided in a predetermined direction from the sealing space toward the external space, and
each of the plurality of concave portions or the plurality of convex portions provided in the predetermined direction is provided at a position deviating from a direction crossing the predetermined direction.

5. The organic electroluminescent device according to claim 3,
wherein in a state in which the first region and the second region are bonded to each other, the convex portions and the concave portions are provided such that the first region engages with the second region.

6. The organic electroluminescent device according to claim 1,
wherein the wall surface is provided so as to connect the end portion located at the side of the sealing space to the end portion located at the side of the external space, and at least a portion of the wall surface is bent.

7. The organic electroluminescent device according to claim 1, further comprising:
a wiring line that connects the light-emitting element provided in the sealing space to an external element provided in the external space,
wherein the wiring line is provided on the flat surface.

8. The organic electroluminescent device according to claim 7,
wherein the first member has a flat region that is connected to and is almost equal to the flat surface of the first region in each of the sealing space and the external space in the first region, and
the wiring line is provided so as to be continuous to each of the flat surface and the flat region.

9. An electronic apparatus comprising the organic electroluminescent device according to claim 1.

10. A method of manufacturing an organic electroluminescent device, the method comprising:
forming a flat surface and a wall surface near the flat surface in each of a first region of a first member and a second region of a second member; and
bonding the first region of the first member to the second region of the second member so as to form a sealing space for sealing a light-emitting element between the first member and the second member,
wherein the flat surface connects an end portion located at the side of the sealing space to an end portion located at the side of an external space outside the sealing space, and
the wall surface has a first surface that is provided so as to be parallel to a first direction, and a second surface that is provided so as to be parallel to a second direction different from the first direction.

11. The method of manufacturing an organic electroluminescent device according to claim 10,
wherein during the bonding of the first region to the second region, a concave portion or a convex portion to form the wall surface is provided in each of the first and second regions such that the first region engages with the second region.

12. The method of manufacturing an organic electroluminescent device according to claim 11,
wherein during the bonding of the first region to the second region, the first region aligns with the second region by using a connection portion between the first and second surfaces of the wall surface of one of the first region and the second region, and by using a mark put on the other of the first region and the second region.

* * * * *